(12) United States Patent
Lee et al.

(10) Patent No.: US 8,289,027 B2
(45) Date of Patent: Oct. 16, 2012

(54) APPARATUS FOR MONITORING CELL VOLTAGE AND FUEL CELLS USING THE SAME

(75) Inventors: Sang-Yong Lee, Incheon (KR); Sung-Jin Oh, Seoul (KR); Byung-Sun Hong, Seongnam (KR); Mee-Nam Shinn, Yongin (KR)

(73) Assignee: Fuelcell Power, Inc., Seongnam (KR)

( * ) Notice: Subject to any disclaimer, the term of this patent is extended or adjusted under 35 U.S.C. 154(b) by 1473 days.

(21) Appl. No.: 11/815,178

(22) PCT Filed: Jan. 19, 2006

(86) PCT No.: PCT/KR2006/000209
§ 371 (c)(1),
(2), (4) Date: Jul. 31, 2007

(87) PCT Pub. No.: WO2006/083080
PCT Pub. Date: Aug. 10, 2006

(65) Prior Publication Data
US 2009/0305086 A1 Dec. 10, 2009

(30) Foreign Application Priority Data
Feb. 4, 2005 (KR) .......... 10-2005-0010621

(51) Int. Cl.
*G01N 27/416* (2006.01)

(52) U.S. Cl. .......... 324/433; 320/101; 320/162
(58) Field of Classification Search .......... 324/433, 324/426; 320/101, 136, 162; 429/92
See application file for complete search history.

(56) References Cited

U.S. PATENT DOCUMENTS

| 5,714,874 A | 2/1998 | Bonnefoy |
| 5,932,990 A | 8/1999 | Kaneko |
| 6,281,684 B1 * | 8/2001 | James .......... 324/434 |
| 6,891,352 B2 * | 5/2005 | Miyazaki et al. .......... 320/118 |
| 2005/0057219 A1 * | 3/2005 | Kaminski et al. .......... 320/116 |

FOREIGN PATENT DOCUMENTS

| DE | 10228776 | 1/2004 |
| JP | 09-203752 | 8/1997 |
| JP | 09-212265 | 8/1997 |

* cited by examiner

*Primary Examiner* — Edward Tso
*Assistant Examiner* — Aaron Piggush
(74) *Attorney, Agent, or Firm* — Lexyoume IP Meister, PLLC.

(57) ABSTRACT

Disclosed is a cell voltage monitoring apparatus for monitoring output voltages of a plurality of unit cells in a cell having the unit cells. The cell voltage monitoring apparatus includes: a reference voltage generator for generating a predetermined reference voltage from the unit cell generation voltage; a voltage comparator for comparing a generation voltage of a monitor unit cell and the reference voltage; a signal separator for outputting a signal that is electrically separated from an output signal of the voltage comparator; and an operation processor for determining normality of the cell voltage from a signal output by the signal separator.

22 Claims, 4 Drawing Sheets

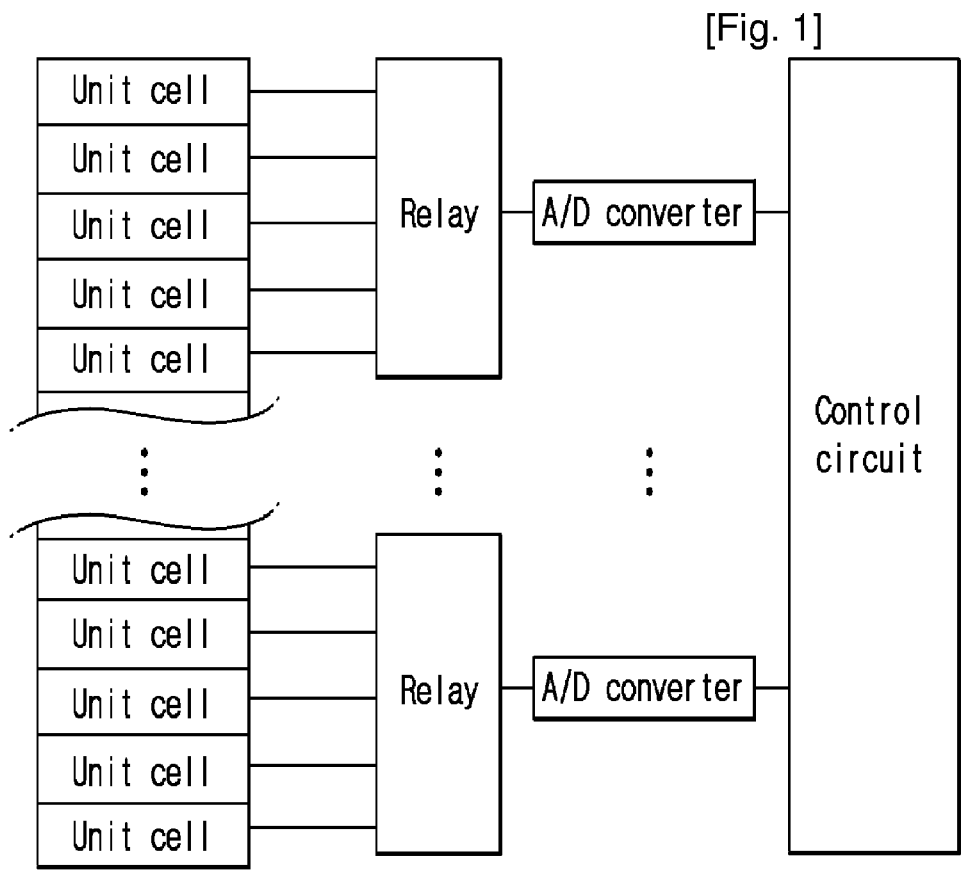
[Fig. 1]
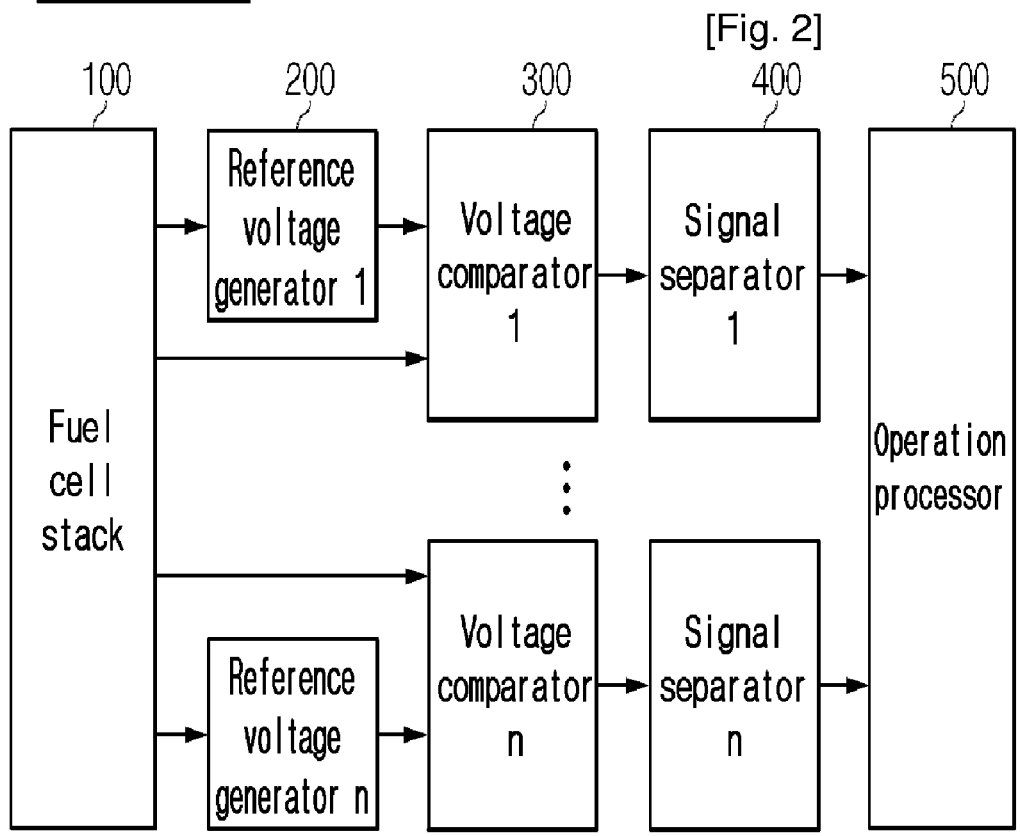
[Fig. 2]

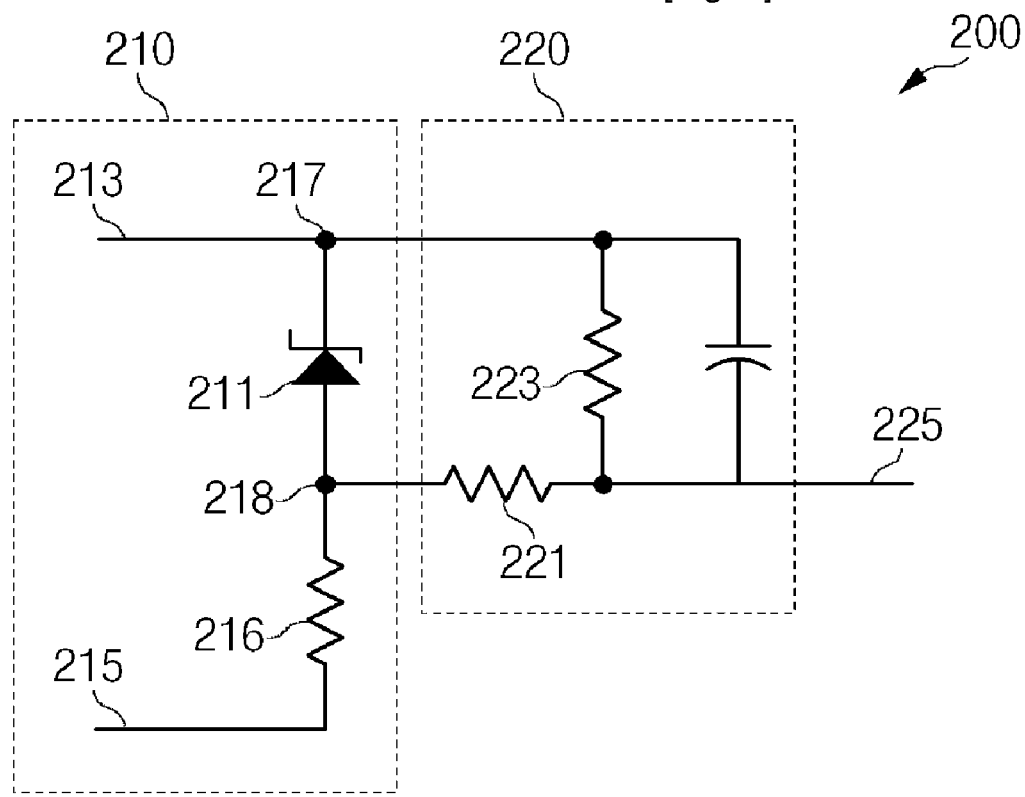
[Fig. 3]
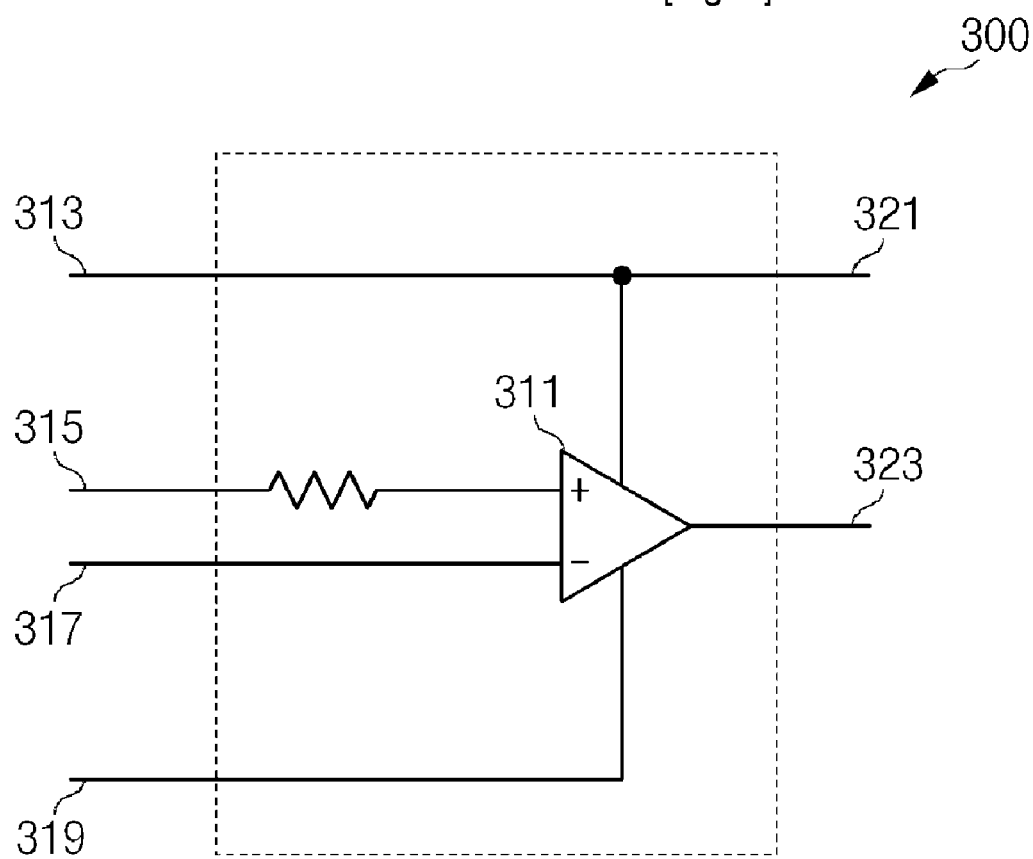
[Fig. 4]

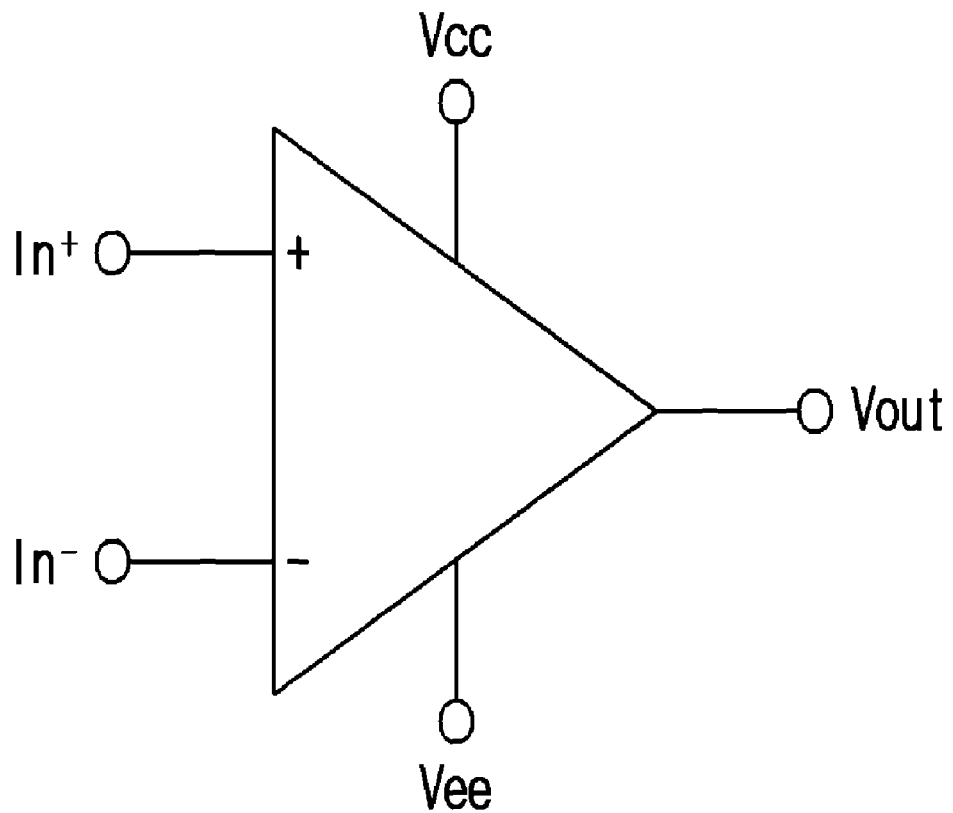
[Fig. 5]
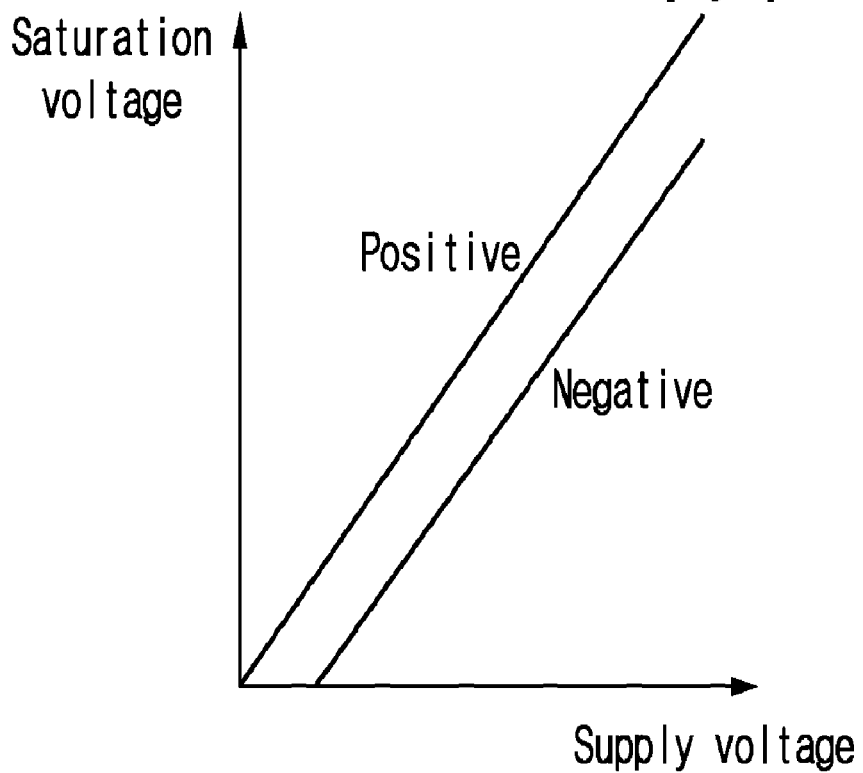
[Fig. 6]

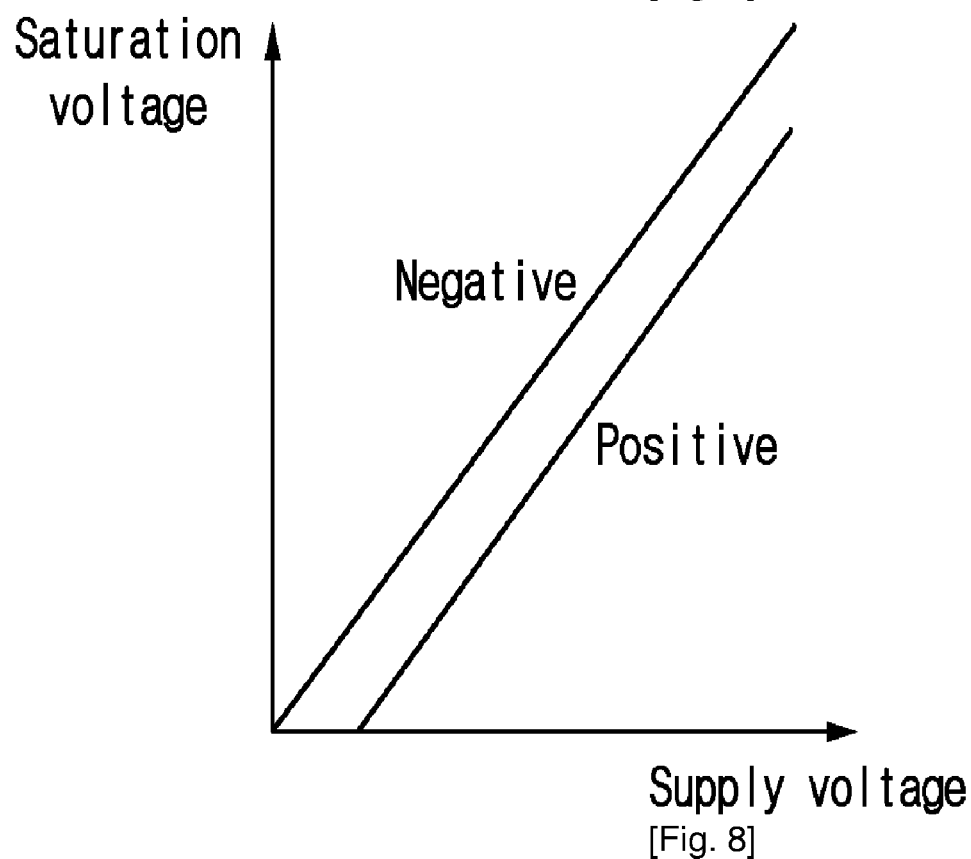
[Fig. 7]
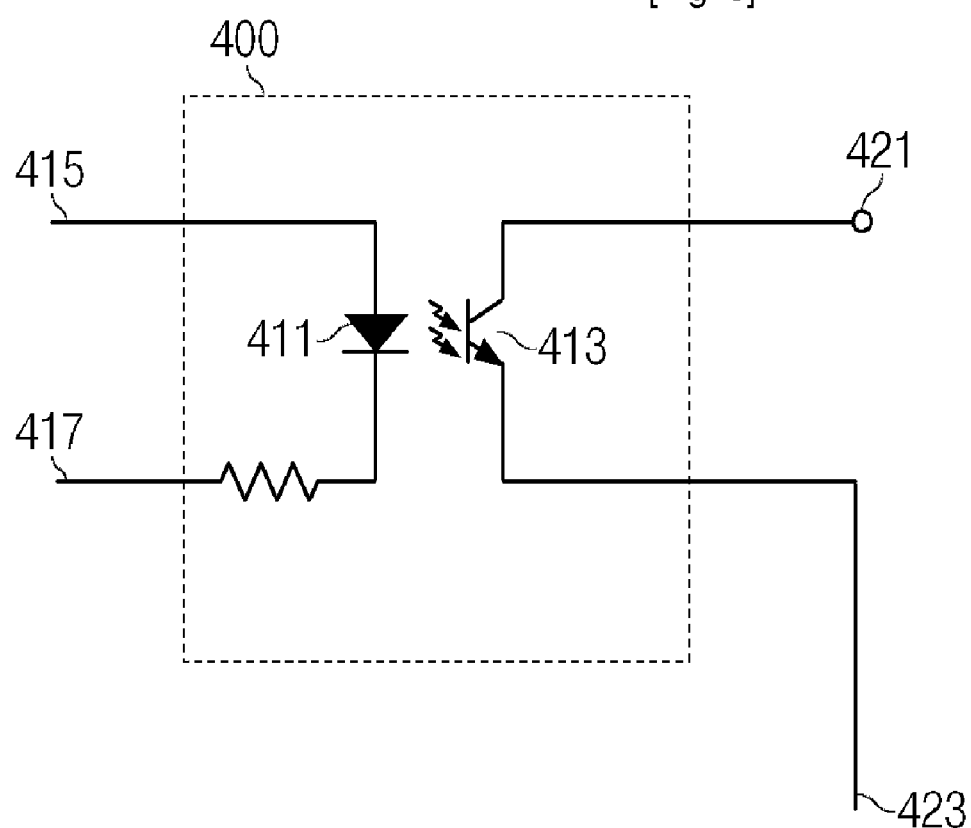
[Fig. 8]

APPARATUS FOR MONITORING CELL VOLTAGE AND FUEL CELLS USING THE SAME

TECHNICAL FIELD

The present invention relates to a cell voltage monitoring apparatus and a cell including the same, and in particular, it relates to a fuel cell voltage monitoring apparatus and a fuel cell including the same.

BACKGROUND ART

A fuel cell is a generator for converting chemical energy generated by oxidation of fuel into electrical energy.

The fuel cell includes a plurality of unit cells coupled in series, and the number of unit cells coupled in series ranges from several tens to several hundreds since output voltages of the unit cells configuring the fuel cell are very low. In this instance, a bundle of cells configured by coupling the unit cells in series is referred to as a fuel cell stack.

The unit cells have different operational states in the configuration of cells because of deviation in the manufacturing process, the temperature in the stack, and non-uniform distribution of compression pressures.

When the performance of a single unit cell in the fuel cell stack is degraded, the membrane of the unit cell is damaged because of a high temperature or the electrode thereof is damaged because of a reverse potential, which also occurs in the adjacent unit cells and hence the operation of the fuel cell stack may be substantially influenced by this problem.

Therefore, it is required to use a monitoring device for measuring the normal operation status of the unit cells by monitoring the voltage of each unit cell or the voltages of a group of unit cells.

One of conventional methods for monitoring the fuel cell stack voltage is to measure the voltage states of respective unit cells by using as many analog/digital converters (hereinafter, referred to as 'A/D converters') as the number of the stacked unit cells. However, the above-noted method uses a plurality of A/D converters to thus problematically increase the cost.

In the configuration of the fuel cell voltage monitoring apparatus, when the current generated in the stack flows outwardly through a cable such as the ground cable, the currents flowing to the anode and the cathode of the stack become different from each other which may cause a chemical imbalance to the electrodes of the fuel cell. Therefore, it is needed for the fuel cell voltage monitoring apparatus to electrically insulate a control circuit from the output current of the unit cell.

In order to perform electrical insulation and reduce the number of A/D converters, a conventional method switches a plurality of unit cells by using a relay or a multiplexer.

FIG. 1 shows a brief configuration of a conventional fuel cell stack monitoring apparatus using relays and A/D converters.

However, the above-noted prior art generates time differences for detecting the voltages of a plurality of cells, and uses relays for separation so that errors may occur because of degradation of contact performance.

Korean Patent Publication No. 2002-56483, Japanese Patent Publication No. 2004-536437, and U.S. Pat. No. 6,816, 797 disclose methods for comparing unit cell voltages with a specific reference voltage and determining voltage greatness to thus simplify signals for monitoring the fuel cell voltage, but they also have a problem of requiring an additional power supply circuit for generating the reference voltage.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

The present invention has been made in an effort to provide a cell voltage monitoring apparatus having advantages of monitoring operations of unit cells in real time.

In addition, the present invention has been made in another effort to provide a cell voltage monitoring apparatus without a power supply circuit by using a generation voltage of a unit cell.

In addition, the present invention has been made in an effort to provide a cell voltage monitoring apparatus for using a generation voltage of a unit cell and using the generation voltage and electrically separated signals as output signals.

In addition, the present invention has been made in an effort to provide a fuel cell for monitoring the generation voltage of the unit cell in real-time.

In addition, the present invention has been made in an effort to provide a fuel cell including a cell voltage monitoring apparatus without an additional power supply circuit, by using the generation voltage of the unit cell.

Technical Solution

An exemplary cell voltage monitoring apparatus according to an embodiment of the present invention includes a reference voltage generator for generating a predetermined reference voltage from the unit cell generation voltage; a voltage comparator for comparing a generation voltage of a monitor unit cell and the reference voltage; a signal separator for outputting a signal that is electrically separated from an output signal of the voltage comparator; and an operation processor for determining normality of the cell voltage from a signal output by the signal separator.

In a further embodiment, provided is a voltage monitoring apparatus of a fuel cell including a plurality of unit cells arranged and coupled in series, wherein the fuel cell voltage monitoring apparatus includes: a reference voltage generator for receiving output voltages from at least two points of the unit cell array, and generating a predetermined reference voltage; a voltage comparator for receiving an output voltage of a first electrode of a monitor unit cell in the unit cell array, an output voltage of a second electrode of the monitor unit cell, and the reference voltage, and determining whether a generation voltage of the monitor unit cell is given within a predetermined allowable voltage range; a signal separator for outputting a signal that is electrically separated from an output signal of the voltage comparator; and an operation processor for determining normality of a cell voltage from a signal output by the signal separator.

In a further embodiment, provided is a fuel cell including a plurality of unit cells arranged and coupled in series. The fuel cell having a cell voltage monitoring apparatus which includes: a reference voltage generator for receiving output voltages from at least two points of the unit cell array and generating a predetermined reference voltage; a voltage comparator for receiving an output voltage of a first electrode of a monitor unit cell in the unit cell array, an output voltage of a second electrode of the monitor unit cell, and the reference voltage, and determining whether a generation voltage of the monitor unit cell is given within a predetermined allowable voltage range; a signal separator for outputting a signal that is electrically separated from an output signal of the voltage comparator; and an operation processor for determining normality of a cell voltage from a signal output by the signal separator.

BRIEF DESCRIPTION OF THE DRAWINGS

FIG. 1 shows a schematic diagram of a fuel cell voltage monitoring apparatus.

FIG. 2 shows a schematic diagram for a fuel cell voltage monitoring apparatus according to an embodiment of the present invention.

FIG. 3 shows a circuit diagram for a reference voltage generator of the fuel cell voltage monitoring apparatus according to the embodiment of the present invention.

FIG. 4 shows a circuit diagram for a voltage comparator of the fuel cell voltage monitoring apparatus according to the embodiment of the present invention.

FIG. 5 shows an operational amplifier (OP Amp) for the voltage comparator according to the embodiment of the present invention.

FIG. 6 and FIG. 7 show saturation characteristics of the operational amplifier shown in FIG. 5.

FIG. 8 shows a circuit diagram for a signal separator of the fuel cell voltage monitoring apparatus according to the embodiment of the present invention.

BEST MODE FOR CARRYING OUT THE INVENTION

An exemplary embodiment of the present invention will hereinafter be described in detail with reference to the accompanying drawings. As those skilled in the art would realize, the described embodiments may be modified in various different ways, all without departing from the spirit or scope of the present invention.

Referring to FIG. 2, a fuel cell voltage monitoring apparatus according to an embodiment of the present invention will be described.

FIG. 2 shows a schematic diagram for a fuel cell voltage monitoring apparatus according to an embodiment of the present invention.

As shown in FIG. 2, the fuel cell voltage monitoring apparatus according to the embodiment of the present invention includes a fuel cell stack 100, a reference voltage generator 200, a voltage comparator 300, a signal separator 400, and an operation processor 500.

The fuel cell stack 100 includes a plurality of unit cells stacked and coupled in series.

In this instance, the fuel cell voltage monitoring apparatus includes a reference voltage generator 200, a voltage comparator 300, and a signal separator 400 for each unit cell. That is, when the number of unit cells is given to be n, n reference voltage generators 200, n voltage comparators 300, and n signal separators 400 are respectively provided and electrically coupled to the n unit cells.

The reference voltage generator 200 generates a predetermined reference voltage so as to determine whether the voltage generated in a test unit cell belongs to an allowable voltage range. The reference voltage is generated by using a unit cell generation voltage acquired from the fuel cell stack 100.

The voltage comparator 300 compares the voltage generated in a unit cell to be monitored (hereinafter, referred to as a 'monitor unit cell') and the reference voltage generated by the reference voltage generator 200, and estimates the voltage generated in the unit cell.

The signal separator 400 transmits a signal that is electrically isolated from the output voltage output by the voltage comparator 300 in response to the voltage output by the voltage comparator 300.

The operation processor 500 determines normality of the fuel cell from the signal output by the signal separator 400.

Respective components of the fuel cell voltage monitoring apparatus according to the embodiment of the present invention will now be described in detail.

The reference voltage generator 200 acquires a reference voltage of a predetermined voltage from the voltages output by at least two points in the array of a plurality of unit cells coupled in series. In this instance, the reference voltage is appropriately established according to the fuel cell's design purpose.

FIG. 3 shows a circuit diagram for the reference voltage generator 200 of the fuel cell voltage monitoring apparatus according to the embodiment of the present invention.

As shown in FIG. 3, the reference voltage generator 200 includes a voltage generator 210 and a voltage divider 220.

The voltage generator 210 includes a voltage regulation element 211 having two input terminals 213 and 215 coupled to two points in the array of a plurality of unit cells. The voltage regulation element 211 may include a Zener diode.

In more detail, the voltage generator 210 has a first terminal 213 coupled to an output terminal on the cathode electrode side of the test unit cell, and a second terminal 215 coupled to an output terminal on the cathode electrode side of a unit cell that is distant in a first direction from the test unit cell by the length of a predetermined unit cell. Accordingly, the voltage generated by the unit cells coupled in series between the first terminal 213 and the second terminal 215 is applied to the voltage regulation element 211 and a resistor 216.

That is, the voltage applied to the voltage regulation element 211 and the resistor 216 corresponds to the voltage difference between the output voltage on the cathode electrode side of the test unit cell (i.e., the first terminal 213) and the output voltage on the cathode electrode side of the unit cell (i.e., the second terminal 215.)

In this instance, the voltage regulation element 211 is turned on when the potential difference between two voltages applied to the two input terminals is greater than a predetermined Zener potential Vz. As a result, a predetermined voltage is given between a first node 217 and a second node 218 of the voltage generator 210.

The voltage generator 210 controls the voltage between the first node 217 and the second node 218 of the voltage generator 210 by selecting the voltage regulation element 211 having a Zener potential Vz appropriate for the design purpose. However, it is desirable to establish the voltage between the first node 217 and the second node 218 to be near the maximum voltage value of the respective unit cells configuring the fuel cell stack.

The resistor 216 is established to be appropriate for the current that is established to flow through the voltage regulation element 211.

The resistor 216 will now be described in detail with the example in which the allowable range of the voltages generated by the unit cells configuring the fuel cell stack is given as 0.4 V to 1.2 V and the desired voltage value to be generated by the voltage generator 210 is 1.2 V.

When eight unit cells with the allowable voltage range from 0.4V to 1.2V are coupled in series to both terminals 213 and 215 of the voltage regulation element 211, the voltage applied to the voltage generator 210 ranges from 3.2V to 9.6V.

In this instance, the load (i.e., voltage) at the resistor 216 ranges from 2 V to 8.4V since the constant voltage of 1.2V is maintained by the voltage regulation element 211. Therefore, the resistor 216 is to be established to be appropriate for driving the voltage regulation element 211 and the voltage divider 220 in correspondence to the load.

The voltage divider 220 divides the voltage generated by the voltage generator 210 into desired voltages. General voltage division circuits may be used for the voltage divider 220.

In the circuit shown in FIG. 3, when the voltage applied to the first terminal 213 of the voltage regulation element 211 is 9.6V, the voltage applied to the second terminal 215 thereof is 0V, and the Zener voltage Vz of the voltage regulation element 211 is 1.2V, a constant voltage of 1.2V is applied to the voltage divider 220. In this instance, the voltage applied to the resistor 223 can be controlled to be a desired voltage by controlling the resistance of the resistors 221 and 223 of the voltage divider 220.

In more detail, the voltage divided by the voltage divider 220 can be established to range from 0.3V to 0.5V in order for each unit cell to maintain the safe drive voltage from 0.6V to 0.8V, and the voltage divided by the voltage divider 220 can be established to range from 0.2V to 0.4V in order for each unit cell to maintain the safe drive voltage of 0.4V. The voltage divided by the voltage divider 220 can be appropriately established according to the design purpose of the stack or the whole system.

When the voltage applied to the first terminal 213 of the voltage generator 210 is predefined to be 9.6V and the voltage divided by the voltage divider 220 is given to be 0.4V, the voltage of 9.6V is controlled by as much as the voltage of 0.4V, and the final reference voltage output to the output terminal 225 of the voltage divider 220 is generated to be 9.2V.

Variable resistors are applicable to the resistors 221 and 223 used for the voltage divider 220, and it is also possible to control the voltage divider 220 corresponding to the test unit cell to divide the voltage into a different voltage.

The voltage comparator 300 receives the reference voltage output by the reference voltage generator 200 and the voltage generated by the test unit cell, determines whether the voltage generated by the test unit cell belongs to a predetermined voltage allowable range, and outputs different voltage signals according to the determination result. That is, voltage comparator 300 compares the reference voltage and the voltage generated by the unit cell, and outputs an operation signal to the signal separator 400 when the voltage generated by the unit cell is greater than the reference voltage, and outputs a sub-operation signal to the signal separator 400 when the voltage generated by the unit cell is less than the reference voltage.

FIG. 4 shows a circuit diagram for the voltage comparator 300 of the fuel cell voltage monitoring apparatus according to the embodiment of the present invention.

As shown in FIG. 4, the voltage comparator 300 includes a comparator 311 having a first input terminal 313 for receiving an output voltage from the cathode electrode of the test unit cell, a second input terminal 315 for receiving an output voltage from the anode electrode of the test unit cell, a third input terminal 317 for receiving an output voltage from the reference voltage generator 200, and a fourth input terminal 319 for receiving the voltage applied to the second terminal 215 of the reference voltage generator; a first output terminal 321 for outputting the voltage applied to the first input terminal 313; and a second output terminal 323 for outputting an output voltage of the comparator 311.

In the voltage comparator 300, a (+) input terminal of the comparator 311 corresponds to the second input terminal 315, a (−) input terminal corresponds to the third input terminal 317, a Vcc terminal corresponds to the first input terminal 313, and a Vee terminal corresponds to the fourth input terminal 319.

The comparator 311 outputs a voltage that is saturated to the voltage applied to the Vcc terminal to the second output terminal 323 when the voltage applied to the (+) input terminal is greater than the voltage applied to the negative (−) input terminal, and it outputs a voltage that is saturated to the voltage applied to the Vee terminal to the second output terminal 323 when the voltage applied to the negative (−) input terminal is greater than the voltage applied to the (+) input terminal.

Therefore, the voltage comparator 300 outputs the voltage that is saturated to the output voltage of the cathode electrode of the test unit cell applied to the Vcc terminal to the second output terminal 323 when the output voltage of the anode electrode of the test unit cell applied to the second input terminal 315 is greater than the reference voltage output by the reference voltage generator 200 applied to the third input terminal 317. In addition, the voltage comparator 300 outputs the voltage that is saturated to the voltage applied to the second terminal 215 of the reference voltage generator 215 applied to the Vee terminal to the second output terminal 323 when the output voltage of the anode electrode of the test unit cell applied to the second input terminal 315 is less than the reference voltage output by the reference voltage generator 200 applied to the third input terminal 317.

As exemplified above, the method for estimating the generation voltage of the 8th unit cell in the case of fuel cell stacks with the n of 8 will now be described in detail on the assumption that the maximum output voltage is given to be 1.2V and the output voltage of the 7th unit cell is fixed to be 8.4V for the second terminal 215.

In this instance, when the generation voltage allowable in the 8th unit cell is greater than 0.4 V, the reference voltage generator 200 outputs the voltage generated by subtracting the voltage of 0.4V from the voltage output by the cathode electrode of the 8th unit cell.

First, when the voltage generated in the 8th unit cell is given to be 0.5V, the output voltage of the cathode electrode of the 8th unit cell is generated to be 8.9V (=8.4V+0.5V), and the reference voltage is generated to be 8.5V (=8.9V−0.4V). In this instance, since the voltage input to the second input terminal 315 of the comparator 311 is 8.4V and the voltage input to the third input terminal of the comparator is 8.5V, the voltage at the third input terminal (the negative (−) input terminal) is greater than that of the second input terminal (the (+) input terminal), the voltage input to the fourth input terminal 319 (the Vee terminal) is output to the second output terminal 323. In this instance, since the voltage output to the first output terminal 321 of the voltage comparator 300 is 8.9V and the voltage output to the second output terminal 323 is near 0V, the potential difference between both output terminals substantially corresponds to 8.9V.

When the voltage generated in the 8th unit cell is 0.3V, the output voltage of the cathode electrode of the 8th unit cell is given as 8.7V (=8.4V+0.3V) and the reference voltage becomes 8.3V (=8.7V−0.4V). In this instance, since the voltage input to the second input terminal 315 of the comparator 311 is 8.4V and the voltage input to the third input terminal of the comparator 311 is 8.3V, the voltage at the second input terminal (the (+) input terminal) is greater than that at the third input terminal (the negative (−) input terminal), the voltage input to the first input terminal 313 (the Vcc terminal) is output to the second output terminal 323. In this instance, since the voltage output to the first output terminal 321 of the voltage comparator 300 is 8.7V and the voltage output to the second output terminal 323 is also near 8.7V, the potential difference between both output terminals is very much less.

Accordingly, the voltage comparator 300 compares the voltage input to the second input terminal 315 of the comparator 311 and the third input terminal 317 thereof and outputs the voltage input to the third input terminal 317 as an output voltage when the voltage input to the second input terminal 315 is greater than the voltage input to the third input terminal 317, and it outputs the voltage input to the fourth input terminal 319 as an output voltage when the voltage input to the third input terminal 317 is greater than the voltage input to the second input terminal 315. Hence, the voltage comparator 300 outputs two different voltages by using the digital signal output method according to the voltage output by the test unit cell.

It is desirable to apply an operational amplifier to the comparator 311 in the embodiment of the present invention.

FIG. 5 shows the operational amplifier (OP Amp) used by the voltage comparator 300 according to the embodiment of the present invention.

General operational amplifiers used for operating analog signals are applicable to the operational amplifier according to the embodiment of the present invention.

As shown in FIG. 5, the operational amplifier used in the embodiment of the present invention receives a non-inverting input signal (in+) and an inverting input signal (in−) through the second input terminal 315 and the third input terminal 317, amplifies the difference of the two signals, and outputs the amplified difference signal to the Vout terminal 323 (the second output terminal.)

The output voltage that is the amplified difference signal is saturated to the Vcc terminal input voltage when the non-inverting input signal (in+) is greater than the inverting input signal (in−), and it is saturated to the Vee terminal input voltage when the inverting input signal (in−) is greater than the non-inverting input signal (in+).

Operational amplifiers having the saturation characteristics of FIG. 6 or FIG. 7. are used in the embodiment of the present invention.

FIG. 6 shows an operational amplifier having a saturation characteristic of a power source coupled to the Vcc terminal, and FIG. 7 shows an operational amplifier having a saturation characteristic of a power source coupled to the Vee terminal.

As can be known by the negative voltage graph in FIG. 6 and the positive voltage graph in FIG. 7, the saturation voltage is lower than the supply voltage when the negative voltage is supplied in FIG. 6 and the positive voltage is supplied in FIG. 7.

As the operational amplifier has the above-noted saturation characteristic, a power source above the saturation region may be needed when the circuit is configured by using operational amplifiers with a single characteristic.

In order to detect the voltage of the last unit cell in the cathode electrode direction of the fuel cell stack in the case of using the operational amplifier having the characteristic of FIG. 6, the circuit is normally operated when the voltage that is higher by as much as the bias of the saturation voltage of the highest voltage is additionally supplied to the fuel cell stack when the bias of the Vcc terminal's saturation voltage of the used operational amplifier is high such that the bias may influence the circuit operation of the signal separator. Therefore, an additional boosting DC power supply circuit is required.

Further, in order to detect the voltage of the last unit cell in the anode electrode direction of the fuel cell stack in the case of using the operational amplifier having the characteristic of FIG. 7, the circuit is normally operated when the voltage that is higher by as much as the bias of the saturation voltage of the highest voltage is additionally supplied to the fuel cell stack when the bias of the Vee terminal's saturation voltage of the used operational amplifier is high such that the bias may influence the circuit operation. Therefore, an additional DC power supply circuit for generating such a saturation voltage as that in the negative direction is required.

In consideration of the saturation characteristics of the operational amplifiers in the embodiment of the present invention, the unit cells included in the fuel cell are divided into two groups: an operational amplifier having a saturation characteristic of the power source coupled to the Vee terminal is used for the unit cells in the cathode electrode direction, and an operational amplifier having a saturation characteristic of the power source coupled to the Vcc terminal is used for the unit cells in the anode electrode direction. Therefore, no additional power supply circuit is needed since the bias of the saturation voltage does not influence the operation of the circuit.

As a result, the voltage at the second output terminal 323 of the voltage comparator 300 becomes the input voltage at the Vcc terminal or the Vee terminal of the comparator 311. However, the input voltage of the Vcc terminal or the Vee terminal of the comparator 311 is the output voltage of the unit cell which is easy to shake, and hence, the output voltage of the unit cell cannot be used as a signal for determining the normality of the test unit cell.

Therefore, the output voltage of the voltage comparator 300 is converted by the signal separator 400 into a signal that is not influenced by the shake of the unit cell.

The signal separator 400 receives a voltage signal from the voltage comparator 300, and outputs a signal that corresponds to the input voltage signal and is electrically isolated from the same.

In the embodiment of the present invention, the signal separator 400 can generate signals that are electrically isolated from the input voltage signal by using a photocoupler.

FIG. 8 shows a circuit diagram for the signal separator 400 of the fuel cell voltage monitoring apparatus according to the embodiment of the present invention.

The signal separator 400 includes a light emitter 411 having a first terminal 415 coupled to the first output terminal 321 of the voltage comparator 300 and a second terminal 417 coupled to the second output terminal 323 of the voltage comparator 300, and a light receiver 413 having a first terminal 421 as an input terminal for receiving external signals and a second terminal 423 as an output terminal for outputting signals. The light emitter 411 and the light receiver 413 are separately provided in the signal separator 400, and the signals flowing to the light emitter 411 and the signals flowing to the light receiver 413 are electrically separated. The signal separator 400 may include a light emitting diode as the light emitter 411 for emitting light when a predetermined voltage is applied between both terminals 415 and 417, and a photocoupler including a photodiode or a phototransistor as the light receiver 413 that is turned on when the light is applied.

An operation of the signal separator 400 will now be described.

In the light emitter 411, the output voltage (the voltage input to the Vcc terminal of the comparator 311) of the cathode electrode of the target test unit cell is applied to the first terminal 415, and the output voltage of the comparator 311 is applied to the second terminal 417. As described above, the comparator 311 outputs a voltage that is saturated to the Vee terminal input voltage when the generation voltage of the test unit cell is provided within an allowable voltage range, and it outputs a voltage that is saturated to the Vcc terminal input voltage when the generation voltage of the test unit cell is provided out of the allowable voltage range. In this instance, light is emitted when the potential difference between the first terminal 415 and the second terminal 417 is greater than a predetermined light emitting potential. It is desirable to establish the light emitting potential of the light emitter 411 to be greater than the potential difference between the Vcc terminal input voltage of the comparator 311 and the voltage saturated to the Vcc terminal input voltage and to be less than the potential difference between the Vcc input voltage and the voltage saturated to the Vee input voltage. The light receiver 413 transmits the external signals applied to the first terminal 421 to the second terminal 423 in correspondence to the light emitted by the light emitter 411.

Therefore, when the generation voltage in the target test unit cell is given within the allowable range, the Vcc terminal input voltage is applied to the first terminal of the light emitter 415 and the voltage saturated to the Vee terminal input voltage is applied to the second terminal 417, and hence, the potential difference between both terminals 415 and is greater than the light emitting potential so that the light emitter 411 emits light. In this instance, the light receiver 413 outputs the external signal applied to the first terminal 421 to the second terminal 423 in response to the light emission of the light emitter 411.

When the generation voltage in the target test unit cell is not given within the allowable range, the Vcc terminal input voltage is applied to the first terminal of the light emitter 415 and the voltage saturated to the Vcc terminal input voltage is applied to the second terminal 417, and hence, the potential difference between both terminals 415 and is less than the light emitting potential so that the light emitter 411 emits no light. Therefore, the light receiver 413 does not transmit the external signals applied to the first terminal 421 to the second terminal 423.

Therefore, the signal separator 400 transmits the external signals when the generation voltage of the test unit cell is given within the allowable range, and does not transmit the external signals when the generation voltage of the test unit cell is not given within the allowable range.

The signal separators 400 corresponding to the plural unit cells are arranged to be coupled in series since the second terminal of the light receiver is coupled to the first terminal of the neighboring signal separator.

The operation processor 500 generates a problem generation signal when even one unit cell does not generate the voltage within the allowable range in response to all signals output by the signal separators 400 corresponding to the unit cells included in the fuel cell stack.

The operation processor 500 includes an external signal source, an output terminal, and a data line for coupling the external signal source and the output terminal. The data line is coupled by the first terminals 421 and the second terminals 423 of the light receivers 413 of the signal separators 400, and one first terminal 421 of the light receiver 413 is arranged in series so as to be coupled to the second terminal 423 of the neighboring light receiver 413.

Therefore, signals of the external signal source can be transmitted through the data line that is configured to be coupled by the first terminals 421 and the second terminals 423 of the light receivers 413. In this instance, when even one unit cell does not generate a normal voltage, the light emitter 411 corresponding to the unit cell emits no light, and the light receiver corresponding to the light emitter 411 is not turned on, and hence no external signals are transmitted.

Accordingly, since the respective light receivers 413 are coupled in series, the external signals are transmitted to the light receiver 413 and are no longer transmitted to other ones. In this instance, the operation processor 500 determines that no external signals have been transmitted, and hence it can output a normality signal that indicates the state of transmission of external signals by using a 1-bit digital signal.

Therefore, the fuel cell voltage monitoring apparatus checks whether the voltage of unit cells configuring the fuel cell stack is maintained to be greater than a specific value, and it then outputs a 1-bit digital signal when the voltage generated by a unit cell digresses from the normal voltage range.

The fuel cell voltage monitoring apparatus may also have a function of an electrical fuse by using an FPC as a cable for electrically coupling the fuel cell stack and a printed circuit board. In addition, the fuel cell voltage monitoring apparatus may prevent accidents of the stack caused by the circuit when a short circuit occurs or an abnormal voltage occurs by providing a bead, a zero-ohm resistor, or a fuse with a small capacity on the circuit.

The voltage monitoring apparatus used for the fuel cell voltage monitoring apparatus can be also used as a monitoring apparatus for the generation voltages of the respective unit cells configuring a battery pack in the fuel cell stack and various industrial devices using the battery pack.

As described above, the fuel cell voltage monitoring apparatus according to the present invention enables outputs of unit cells by using a 1-bit signal. Therefore, the algorithm and memory for realizing control logic can be substantially reduced since information on the cells can be processed with the 1-bit signal.

In addition, the fuel cell voltage monitoring apparatus may reduce the cost of configuration of the apparatus since it requires no additional power supply circuit by using different saturation characteristics. Accordingly, the fuel cell voltage monitoring apparatus needs no power supply circuit for driving the circuit and thus needs no expensive circuit elements for electrical insulation, and minimizes the circuit for monitoring the fuel cell voltage.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A voltage monitoring apparatus of a fuel cell including a plurality of unit cells arranged and coupled in series, wherein the fuel cell voltage monitoring apparatus comprises:
   a reference voltage generator for receiving output voltages from two points on an array of a plurality of unit cells which are connected in series, and generating a predetermined reference voltage from the output voltages from the two points, at least two unit cells of the array being connected between the two points;
   a voltage comparator for receiving an output voltage of a first electrode of a monitor unit cell in the unit cell array, an output voltage of a second electrode of the monitor unit cell, and the reference voltage, and determining whether a generation voltage of the monitor unit cell is given within a predetermined allowable voltage range;

a signal separator for outputting a signal that is electrically separated from an output signal of the voltage comparator; and an operation processor for determining normality of a cell voltage from a signal output by the signal separator, wherein the voltage comparator comprises a comparator including:

a first input terminal for receiving a voltage applied to a first terminal of the reference voltage generator;

a second input terminal for receiving an output voltage of a second electrode of the monitor unit cell;

a third input terminal for receiving the reference voltage; and a fourth input terminal for receiving the voltage applied to a second terminal of the reference voltage generator.

2. The voltage monitoring apparatus of claim 1, wherein the reference voltage generator comprises a first input unit coupled to a first electrode of the monitor unit cell in the unit cell array and a second input unit coupled to a first electrode of a unit cell that is distant from the monitor unit cell by as many as unit cells in a first direction.

3. The voltage monitoring apparatus of claim 2, wherein the reference voltage generator comprises a voltage regulation element having a first terminal coupled to the first input unit and a second terminal coupled to the second input unit.

4. The voltage monitoring apparatus of claim 2, wherein the reference voltage generator comprises a voltage division circuit including a plurality of resistors, and generates a predetermined reference voltage by using the voltage division circuit.

5. The voltage monitoring apparatus of claim 1, wherein in the voltage comparator, the first input terminal receives an output voltage of a cathode electrode of a monitor unit cell, and the second input terminal receives an output voltage of an anode electrode of the monitor unit cell.

6. The voltage monitoring apparatus of claim 1, wherein the voltage comparator outputs an operation signal when the voltage input to the third input terminal is greater than the voltage input to the second input terminal.

7. The voltage monitoring apparatus of claim 6, wherein the operation signal is the voltage applied to the fourth input terminal.

8. The voltage monitoring apparatus of claim 1, wherein the comparator includes an operational amplifier having a first terminal as the first input terminal and a second terminal as the fourth input terminal.

9. The voltage monitoring apparatus of claim 8, wherein the operational amplifier comprises:

a first type of operational amplifier having a saturation characteristic of a power source coupled to the first terminal, and a second type of operational amplifier having a saturation characteristic of a power source coupled to the second terminal.

10. The voltage monitoring apparatus of claim 9, wherein the unit cells are divided into a first unit cell group and a second unit cell group in the direction of the cathode electrode direction or the anode electrode direction of the fuel cell, the second type of operational amplifier is used for the first unit cell group, and the first type of operational amplifier is used for the second unit cell group.

11. The voltage monitoring apparatus of claim 1, wherein the signal separator comprises:

a light emitter for emitting light in response to an output signal of the voltage comparator; and a light receiver for outputting an external signal that is electrically separated from the signal applied to the light emitter in response to the light emitted by the light emitter.

12. The voltage monitoring apparatus of claim 1, wherein the operation processor comprises an external signal source, an output terminal, and a data line for coupling the external signal source and the output terminal, and the data line is configured by coupling first terminals of light receivers of the signal separators and second terminals of light receivers of neighboring signal separators.

13. The voltage monitoring apparatus of claim 12, wherein the operation processor outputs a problem generation signal when at least one unit cell does not generate a voltage within an allowable range in response to signals output by the signal separators corresponding to the unit cells.

14. The voltage monitoring apparatus of claim 12, wherein in the fuel cell voltage monitoring apparatus, no signals provided from the external signal source are transmitted to the operation processor when a problem occurs in at least one unit cell from among the unit cells.

15. A fuel cell including a plurality of unit cells arranged and coupled in series, the fuel cell comprising a cell voltage monitoring apparatus which comprises:

a reference voltage generator for receiving output voltages from two points on an array of a plurality of unit cells which are connected in series and generating a predetermined reference voltage from the output voltages from the two points, at least two unit cells of the array being connected between the two points;

a voltage comparator for receiving an output voltage of a first electrode of a monitor unit cell in the unit cell array, an output voltage of a second electrode of the monitor unit cell, and the reference voltage, and determining whether a generation voltage of the monitor unit cell is given within a predetermined allowable voltage range;

a signal separator for outputting a signal that is electrically separated from an output signal of the voltage comparator; and an operation processor for determining normality of a cell voltage from a signal output by the signal separator, wherein the voltage comparator comprises a comparator including:

a first input terminal for receiving a voltage applied to a first terminal of the reference voltage generator;

a second input terminal for receiving an output voltage of a second electrode of the monitor unit cell in the unit cell array;

a third input terminal for receiving the reference voltage; and a fourth input terminal for receiving the voltage applied to a second terminal of the reference voltage generator.

16. The fuel cell of claim 15, wherein the reference voltage generator comprises a first input unit coupled to a first electrode of the monitor unit cell in the unit cell array and a second input unit coupled to a first electrode of a unit cell that is distant from the monitor unit cell by as many as unit cells in a first direction.

17. The fuel cell of claim 16, wherein the reference voltage generator comprises a voltage regulation element having a first terminal coupled to the first input unit and a second terminal coupled to the second input unit.

18. The fuel cell of claim 15, wherein the comparator includes an operational amplifier having a first terminal as the first input terminal and a second terminal as the fourth input terminal.

19. The fuel cell of claim 18, wherein the operational amplifier comprises:
   a first type of operational amplifier having a saturation characteristic of a power source coupled to the first terminal, and
   a second type of operational amplifier having a saturation characteristic of a power source coupled to the second terminal.

20. The fuel cell of claim 19, wherein the unit cells are divided into a first unit cell group and a second unit cell group in the cathode electrode direction or the anode electrode direction of the fuel cell,
   the second type of operational amplifier is used for the first unit cell group, and
   the first type of operational amplifier is used for the second unit cell group.

21. The fuel cell of claim 20, wherein the signal separator comprises:
   a light emitter for emitting light in response to an output signal of the voltage comparator; and
   a light receiver for outputting an external signal that is electrically separated from the signal applied to the light emitter in response to the light emitted by the light emitter.

22. The fuel cell of claim 15, wherein in the fuel cell voltage monitoring apparatus, no signals provided from an external signal source are transmitted to the operation processor when a problem occurs in at least one unit cell from among the unit cells.

* * * * *